US009146255B2

(12) United States Patent
Appleton et al.

(10) Patent No.: US 9,146,255 B2
(45) Date of Patent: Sep. 29, 2015

(54) HIGH VOLTAGE INTERROGATOR PLUG WITH EXTERNAL GROUNDING

(71) Applicant: BAE Systems Land & Armaments, L.P., Santa Clara, CA (US)

(72) Inventors: Randall J. Appleton, West St. Paul, MN (US); Juleigh M. Perona, Fridley, MN (US)

(73) Assignee: BAE Systems Land & Armaments, L.P., Santa Clara, CA (US)

( * ) Notice: Subject to any disclaimer, the term of this patent is extended or adjusted under 35 U.S.C. 154(b) by 146 days.

(21) Appl. No.: 13/839,691

(22) Filed: Mar. 15, 2013

(65) Prior Publication Data

US 2014/0266151 A1    Sep. 18, 2014

(51) Int. Cl.
| | |
|---|---|
| *G01R 19/00* | (2006.01) |
| *G01R 1/04* | (2006.01) |
| *H01R 31/06* | (2006.01) |
| *G01R 1/067* | (2006.01) |
| *H01R 13/53* | (2006.01) |
| *H01R 13/66* | (2006.01) |

(52) U.S. Cl.
CPC .............. *G01R 1/0416* (2013.01); *H01R 31/06* (2013.01); *G01R 1/06777* (2013.01); *H01R 13/53* (2013.01); *H01R 13/6666* (2013.01); *H01R 2201/20* (2013.01)

(58) Field of Classification Search
CPC ...... H01R 31/08; H01R 13/112; H01R 11/12; H01R 11/15; H01R 13/5202; H01R 13/5205; H01R 13/6485; H01R 13/652; H01R 13/6581; H01R 2201/20; H01R 31/06; H01R 13/6666; H01R 13/56; G01R 1/04; G01R 15/04; G01R 15/14; G01R 1/0416; G01R 19/00; G01R 1/06777; G01R 19/0084; G01R 19/0092; G01R 19/145

USPC ............. 324/76.11, 149, 133, 508, 126, 72.5, 324/76.01, 120, 507, 522, 537, 555, 713, 324/756.02; 320/139; 439/711

See application file for complete search history.

(56) References Cited

U.S. PATENT DOCUMENTS

| | | | | |
|---|---|---|---|---|
| 3,205,436 | A * | 9/1965 | Donahue | 324/508 |
| 3,551,881 | A | 12/1970 | Lockie et al. | |
| 4,424,490 | A * | 1/1984 | Mamet et al. | 324/424 |
| 5,077,520 | A * | 12/1991 | Schweitzer, Jr. | 324/133 |
| 7,193,837 | B1 | 3/2007 | Epstein | |
| 7,238,058 | B1 | 7/2007 | French | |
| 7,419,397 | B2 | 9/2008 | Casperson et al. | |
| 7,901,228 | B2 | 3/2011 | Hughes et al. | |
| 8,292,651 | B1 * | 10/2012 | Lakeman et al. | 439/345 |
| 2003/0210503 | A1 * | 11/2003 | McConaughy | 361/38 |

* cited by examiner

*Primary Examiner* — Arleen M Vazquez
*Assistant Examiner* — Lee Rodak
(74) *Attorney, Agent, or Firm* — Patterson Thuente Pedersen, P.A.

(57) ABSTRACT

An interrogator plug for interfacing with the output socket of a pulsed power system to provide external leads engageable by a volt measurement device. The interrogator plug is sized to replicate a conventional plug such that the interrogator plug can be inserted into the output plug. The interrogator plug has lead assemblies positioned to engage the contacts of the output socket ordinarily engaged by conventional plugs. The interrogator plug can also include a divider circuit linked to a coaxial output for providing a reduced voltage current having an operational voltage safely measurable by conventional voltmeters.

11 Claims, 3 Drawing Sheets

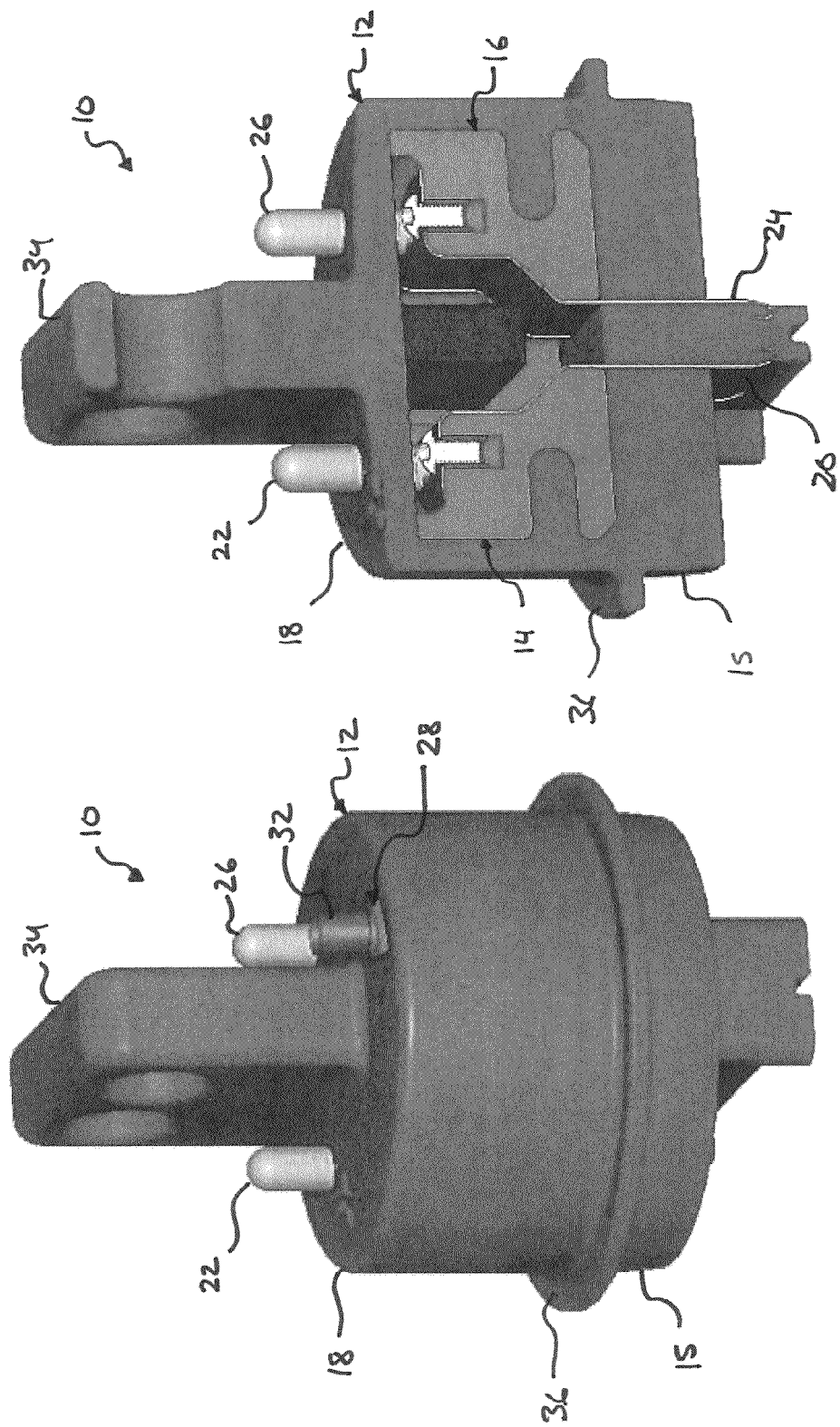

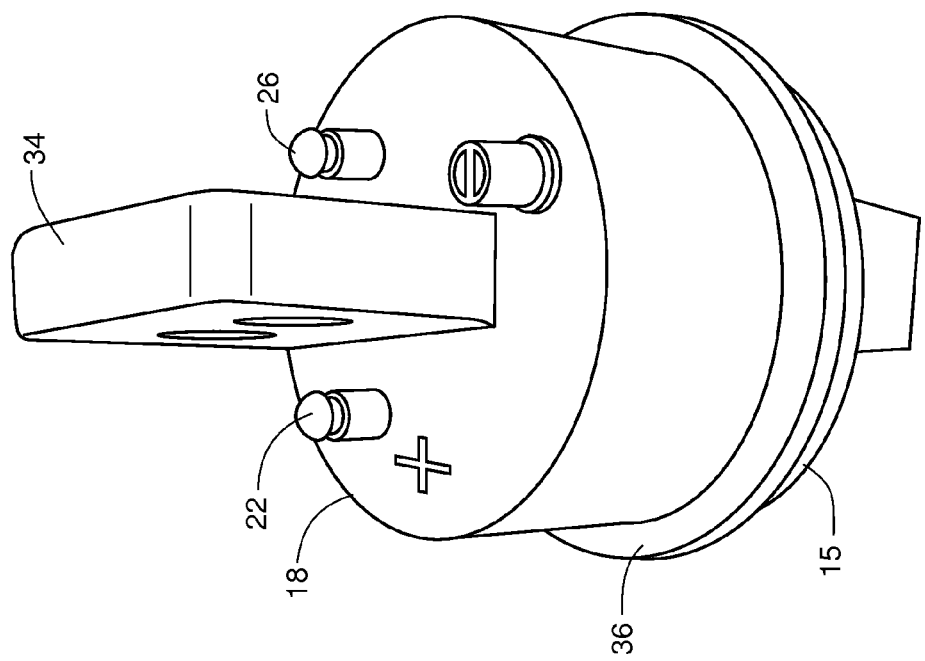
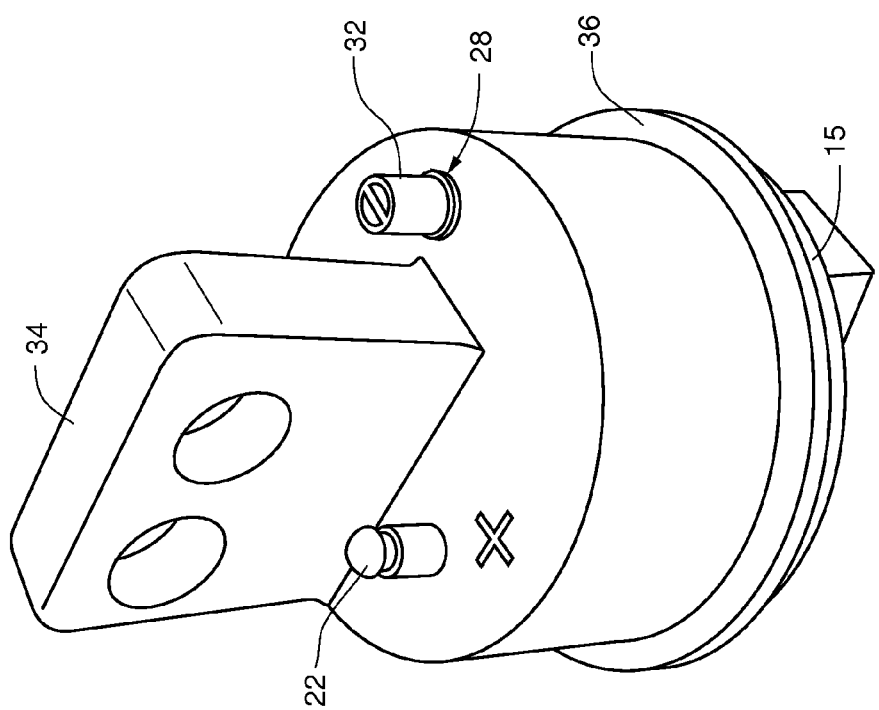

HIGH VOLTAGE INTERROGATOR PLUG WITH EXTERNAL GROUNDING

FIELD OF THE INVENTION

The present invention is generally directed to a plug for a pulsed power system. Specifically, the present invention is directed to an interrogator plug for providing an interface for safely linking an interrogator system with the pulsed power system.

BACKGROUND OF THE INVENTION

Pulsed power systems are electrical power systems that convert a continuous electrical current into a series of high voltage bursts of energy. These specialized power systems are commonly employed with radar systems in which large bursts of energy are used to detect aircraft. An inherent challenged of pulsed power systems is that the high voltage and discontinuous current stream make monitoring the electrical characteristics of the output from the pulsed power system difficult. Specifically, measuring the voltage outputted by the pulsed power systems in real time particularly challenging.

Typically, the voltage across an electrical circuit having a constant current is measured by attaching the electrical leads to the input and output of the circuit and measuring the change in potential across the circuit as constant current is supplied to the circuit. However, pulsed power systems do not have constant current, but rather store quantities of energy in an internal storage device, such as a capacitor bank, before discharging the energy in high voltage bursts. The discontinuous bursts of energy hinder real time monitoring of the voltage across pulsed power electrical systems through conventional means. Moreover, the high operational voltages typical of pulsed power systems often exceed the operational limits of most conventional voltmeters and similar monitoring systems.

In addition, the large quantities of energy stored and discharged by the pulsed power systems can create a substantial safety risk for operators monitoring the operating conditions and maintaining the pulsed power systems. Specifically, the significant amount of energy stored within the internal storage device of the pulsed power supply can create a substantial arcing if inadvertently discharged during testing or maintenance. In particular, attaching the leads of the voltmeter and other monitoring system can result in inadvertent discharge of energy that can resulting in damage to the power system or injury to the user.

While the benefits of pulsed power systems are substantial, a method or device for safely monitoring the electrical characteristics of pulsed power systems is required to improve the overall effectiveness of the systems.

SUMMARY OF THE INVENTION

The present invention is directed to an interrogator plug for interfacing with a conventional output socket of a pulsed power system. The interrogator plug can comprise a plug body replicating the shape and size of a conventional plug used for ordinary operation of the pulse power system. The interrogator plug can further comprise two lead assemblies extending through the plug body. Each lead assembly comprises an internal contact positioned to engage one of the contacts of the output socket and an external lead protruding from the plug body. A voltmeter or equivalent device for monitoring the characteristics of the internal storage device can be safely engaged to the external leads without exposing the circuitry of the power supply device and risk injury to the operator or damage to the circuitry. Alternatively, the external leads can be used to hard short the internal storage device grounding the pulse power system allowing users to safely perform maintenance on the pulse power supply. The external leads can also provide a visual indicator if the pulsed power system is still charged and poses a safety risk.

According to an embodiment of the present invention, the interrogator plug can further comprise a voltage divider operably engaged to the two lead assemblies. The voltage divider is adapted to provide a current to a coax output on the exterior of the plug body, wherein the current has voltage within the operational ranges of conventional voltage meters. Conventional digital voltage meters can be safely engaged to the coax output without the risk that high voltage bursts typical of the pulsed power system will overwhelm the meter and create a safety risk.

The above summary of the various representative embodiments of the invention is not intended to describe each illustrated embodiment or every implementation of the invention. Rather, the embodiments are chosen and described so that others skilled in the art can appreciate and understand the principles and practices of the invention. The figures in the detailed description that follow more particularly exemplify these embodiments.

BRIEF DESCRIPTION OF THE FIGURES

The invention can be completely understood in consideration of the following detailed description of various embodiments of the invention in connection with the accompanying drawings, in which:

FIG. 1 is a perspective view of an interrogator plug according to an embodiment of the present invention.

FIG. 2 is a cross-sectional perspective view of an interrogator plug according to an embodiment of the present invention

FIG. 5 is a perspective view of the exterior portion of an interrogator plug according to an embodiment of the present invention.

FIG. 6 is a perspective view of the exterior portion of an interrogator plug of FIG. 5.

Figure 4:
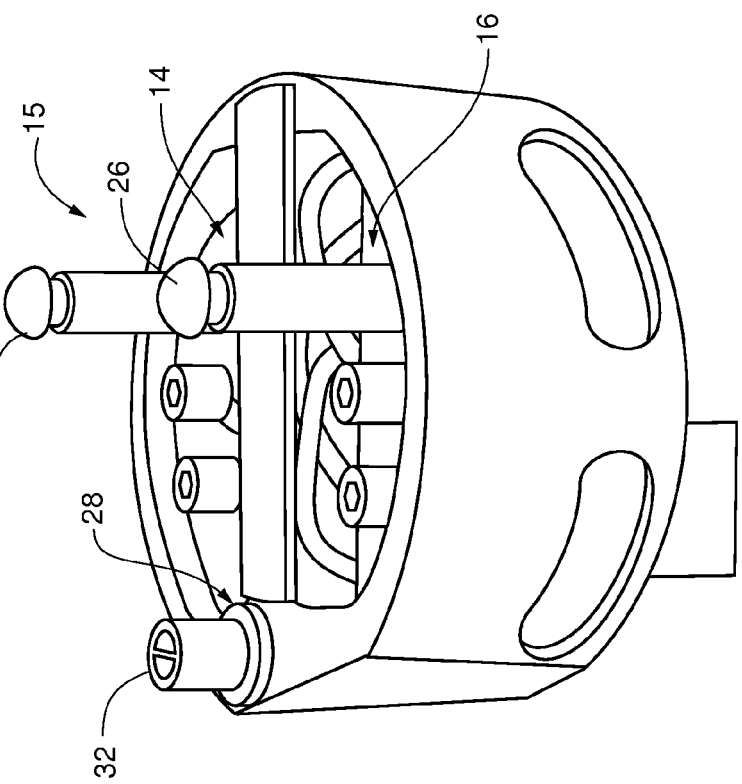
FIG. 4 is a perspective view of an interrogator plug of FIG. 3.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE FIGURES

A pulsed power system 2 generally comprises an internal power storage device 4 and at least one output socket 6. Each output socket 6 defines a cavity sized to receive a conventional plug and comprises two contacts 8 operably linked to the internal power storage device 4. In operation, a conventional plug is inserted into the output socket 6 such that the contacts of the conventional plug align with and engage the contacts 8 of the output socket 6. The operational voltage of a pulsed power system 2, for use with an embodiment of the present invention, can generally comprise about 10 kV.

As shown in FIGS. 1-2, an interrogator plug 10, according to an embodiment of the present invention, comprises a plug body 12, a first lead assembly 14 and a second lead assembly 16. The plug body 12 comprises a plug portion 15 insertable into the output socket 6 and exterior portion 18 extending out of the output socket 6 when the plug body 12 is inserted into the output socket 6. The first lead assembly 14 comprises a first contact 20 operably linked to a first external lead 22 extending from the exterior portion 18 of the plug body 12. Similarly, the second lead assembly 16 comprises a second contact 24 operably linked to a second external lead 26. The first contact 20 and the second contact 24 are positioned to separately engage the contacts 8 when the interrogator plug 10 is inserted into the output socket 6.

Figure 3:
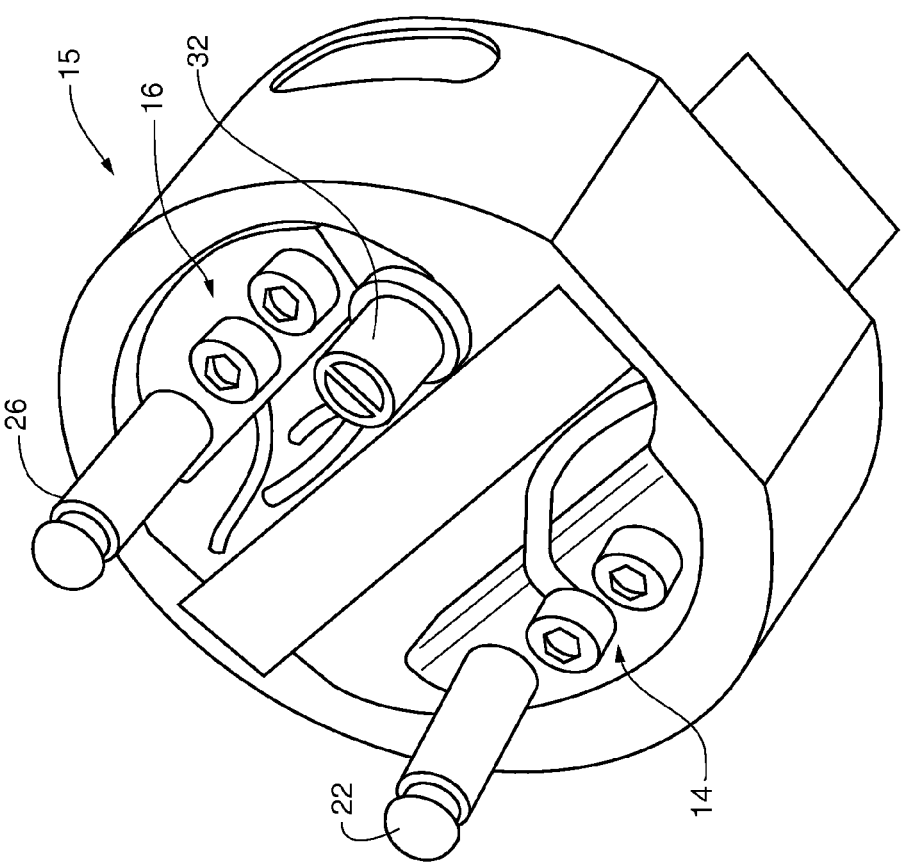
FIG. 3 is a perspective view of an interrogator plug according to an embodiment of the present invention with the exterior portion removed.

As shown in FIGS. 1-4, according to an embodiment of the present invention, the interrogator plug 10 can further comprise a voltage divider assembly 28 having a voltage divider circuit 30 and a coaxial output 32. The voltage divider circuit 30 is operable engaged to the first lead assembly 14 and a second lead assembly 16 so as to provide a reduced voltage current to the coaxial output 32. The voltage divider circuit 30 is adapted to provide a reduced voltage current. In operation, the coaxial output 32 can be engaged by the input of a conventional voltage meter to measure the reduced voltage current.

As shown in FIG. 5-6, according to an embodiment of the present invention, the plug body 12 can further comprise safety fin 34 positioned between the first external lead 22 and the second external lead 25. The safety fin 34 can comprise a non-conductive material to prevent arcing between the first and second external leads 22, 26. Similarly, the safety fin 34 is sized to increase the effective distance between the leads 22, 26 to prevent arcing or users from accidentally creating a short when affixing contacts of a meter or other voltage monitoring device.

As shown in FIGS. 5-6, according to an embodiment of the present invention, the plug body 12 can further comprise a lip 36 positioned on the exterior of the plug body 12 adapted to seal the output socket 6 when the plug body 12 is inserted into the output socket 6. The lip 36 prevents contaminants from entering the output socket 6 and causing damage to the internal systems of the pulsed power system 2.

Although specific examples have been illustrated and described herein, it will be appreciated by those of ordinary skill in the art that any arrangement calculated to achieve the same purpose could be substituted for the specific examples shown. This application is intended to cover adaptations or variations of the present subject matter. Therefore, it is intended that the invention be defined by the attached claims and their legal equivalents, as well as the following illustrative embodiments.

The invention claimed is:

1. An interrogator plug for monitoring the voltage characteristics of power storage device of a pulsed power system, comprising:
    a plug body having an exterior portion and a plug portion, the plug portion insertable into an output socket of the power storage device of the pulsed power system, wherein the plug portion is sized to replicate the size and shape of the portion of a conventional plug insertable into the output socket; the plug body housing comprising:
    a first lead assembly having a first contact operably engaged with a first external lead extending from the exterior portion of the plug body, wherein the first contact is positioned to engage at least one contact of the output socket of the pulsed power system;
    a second lead assembly having a first contact operably engaged with a second external lead extending from the exterior portion of the plug body, wherein the first contact is positioned to engage at least one contact of the output socket of the pulsed power system;
    a voltage divider circuit operably engaged to the first and second lead assemblies for providing a voltage below 10 kV; and
    a coaxial output positioned on the exterior portion of the plug body engagable by a voltage measurement device for measuring the reduced voltage provided by the voltage divider circuit.

2. The interrogator plug of claim 1, wherein the first and second external leads are engagable by the inputs of the voltage measurement device to measure the voltage characteristics of the internal storage device of the pulsed power device.

3. The interrogator plug of claim 1, further comprising:
    a shorting circuit engagable to the first and second external leads to hard short the internal storage device of the pulsed power device.

4. The interrogator plug of claim 1, further comprising:
    a lip positioned between the exterior portion and plug portion for sealing the output socket when the plug portion is inserted into output socket to prevent foreign particulate from entering the output socket.

5. The interrogator plug of claim 1, further comprising:
    a safety fin positioned between the first and second external leads to prevent accidental shorts and arcing between the external leads.

6. The interrogator plug of claim 5, wherein the safety fin comprises a non-conductive material.

7. A method for monitoring the voltage characteristics of an internal power storage device of a pulsed power system, comprising:
    inserting a plug body having at least two lead assemblies into an output socket operably linked to the internal power storage device of the pulsed power system, wherein each lead assembly comprises an external lead and a contact;
    positioning the contacts of the lead assemblies such that the contact of each lead assembly engages at least one contact of the output socket of the pulsed power system;
    engaging the inputs of a volt measurement device to the external leads to measure the voltage characteristics of the internal storage device of the pulsed power device;
    engaging a voltage divider circuit adapted to provide a reduced voltage to the first and second lead assemblies;
    providing a voltage below 10 kV; monitoring the voltage through a coaxial output positioned on the exterior portion of the plug body, said coaxial output engagable by the voltage measurement device for measuring the reduced voltage provided by the voltage divider circuit.

8. The method of claim 7, further comprising:
    shorting the internal storage device by engaging a shorting circuit to the external leads of the lead assemblies.

9. The method of claim 7, further comprising:
    positioning a lip between the exterior portion and plug portion for sealing the output socket when the plug portion is inserted into output socket to prevent foreign particulate from entering the output socket.

10. The method of claim 7, further comprising:
    positioning a safety fin between the first and second external leads to prevent accidental shorts and arcing between the external leads.

11. The method of claim 10, wherein the safety fin comprises a non-conductive material.

* * * * *